United States Patent [19]

Kinoshita et al.

[11] Patent Number: 4,663,669
[45] Date of Patent: May 5, 1987

[54] IMAGE SENSING APPARATUS

[75] Inventors: Takao Kinoshita, Tokyo; Shinji Sakai, Yokohama; Akira Suga, Yokohama; Akihiko Tojo, Yokohama, all of Japan

[73] Assignee: Canon Kabushiki Kaisha, Tokyo, Japan

[21] Appl. No.: 694,842

[22] Filed: Jan. 25, 1985

[30] Foreign Application Priority Data

Feb. 1, 1984 [JP] Japan ................................. 59-16790
Feb. 1, 1984 [JP] Japan ................................. 59-16791
Feb. 7, 1984 [JP] Japan ................................. 59-20515

[51] Int. Cl.⁴ ............................................. H04N 3/14
[52] U.S. Cl. ........................... 358/213.19; 358/213.26
[58] Field of Search ............... 358/213, 212, 221, 909; 357/24 LR

[56] References Cited

U.S. PATENT DOCUMENTS 4,328,432 5/1982 Yamazaki ...................... 357/24 LR
4,359,759 11/1982 McBride et al. ................... 358/221
4,443,886 4/1984 Matsumoto et al. ........... 357/24 LR
4,462,047 7/1984 Fujimoto et al. .................... 358/213
4,551,758 11/1985 Masunaga et al. .................. 358/213

Primary Examiner—Gene Z. Rubinson
Assistant Examiner—Stephen Brinich
Attorney, Agent, or Firm—Fitzpatrick, Cella, Harper & Scinto

[57] ABSTRACT

An image sensing apparatus comprises: a photodetector for converting an optical image to a charge signal; a recombination circuit for recombining a portion of the charges in the photodetector with the majority carrier; an instruction circuit for instructing change-over between the still mode, in which only one predetermined image signal is formed in the photodetector, and the movie mode, in which a plurality of image signals are formed; and a controller for switching the recombining capability by the recombination circuit during the formation of an image in accordance with an instruction output of the instruction circuit, in which the recombining capability in the still mode is controlled so as to be higher than that in the movie mode.

30 Claims, 21 Drawing Figures

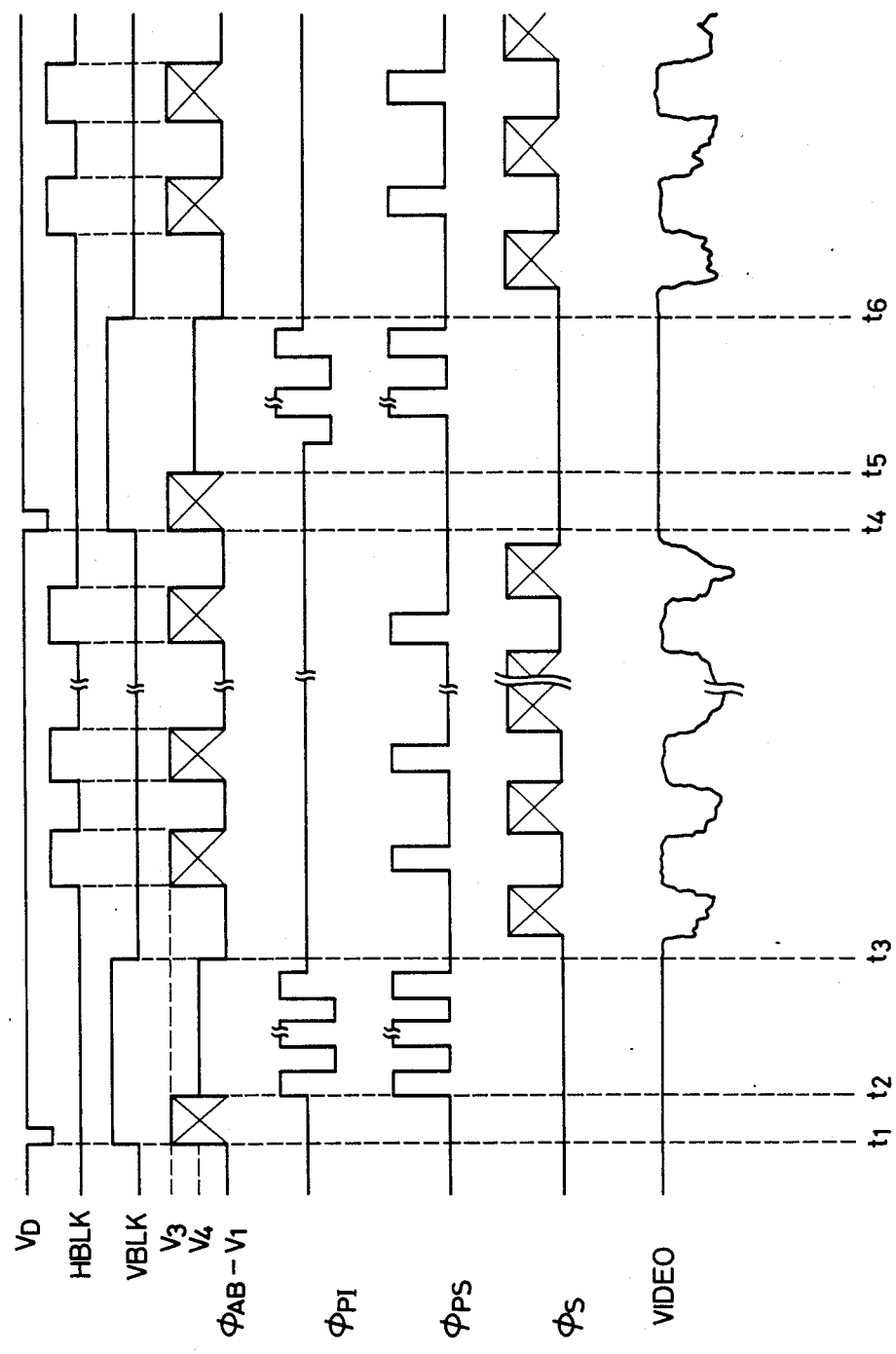

IMAGE SENSING APPARATUS

FIELD OF THE INVENTION

The present invention relates to an image sensing apparatus which can effectively suppress blooming.

BACKGROUND OF THE INVENTION

As desclosed in Japanese Laid-Open Patent Application (Kokai) No. 138371/1981, there has been conventionally considered a solid state image sensor such as a CCD or the like in which in order to prevent blooming, excess carriers are extinguished by use of surface recombination, in place of providing an overflow drain in the photodetecting surface.

Image sensors using this method have the advantages that sensitivity is high, since the aperture ratio in the photodetecting surface is not sacrificed, and horizontal resolution is raised, since the degree of integration can be improved, and the like.

FIGS. 1 to 3 are diagrams for explaining such a method of preventing blooming by means of surface recombination. FIG. 1 is a front view of a general frame transfer type CCD.

In the diagram, a photodetector 1 consists of a plurality of vertical shift registers having photosensitivity.

A storage section 2 consists of a plurality of vertical shift registers which are shielded from light.

Reference numeral 3 denotes a horizontal shift register. The information in each vertical shift register in the storage section 2 can be taken in this horizontal shift register by simultaneously shifting the contents of the vertical registers one bit, and then a video signal can be derived from an output amplifier 4 by allowing the register 3 to perform the horizontal transfer operation.

Generally, the information formed in each vertical shift register of the photodetector 1 is vertically transferred to the storage section 2 within the vertical blanking interval in the standard television system and is sequentially read out line by line by the horizontal shift register 3 during the next vertical scan interval.

It is now assumed that the photodetector 1, storage section 2 and horizontal shift register 3 are respectively two-phase drive and respective transfer electrodes are $P_1$, $P_2$, $P_3$, $P_4$, $P_5$, and $P_6$, and their transfer clocks are ($\phi P_1$, $\phi P_2$), ($\phi P_3$, $\phi P_4$), and ($\phi P_5$, $\phi P_6$).

FIG. 2 is a diagram showing a potential profile below such transfer electrodes $P_1$ to $P_6$. A low potential portion and a high potential portion with regard to the electrons are formed due to ion implantation or the like below each electrode which is provided, for example, over a P-type silicon substrate 6 through an insulation layer 5. For instance, when a low level voltage $-V_1$ is applied to the electrodes $P_2$, $P_4$ and $P_6$ and a high level voltage $V_2$ is applied to the electrodes $P_1$, $P_3$ and $P_5$, the potentials as indicated by a solid line in the diagram are formed. On the contrary, when the low level voltage $-V_1$ is applied to the electrodes $P_1$, $P_3$ and $P_5$ and the high level voltage $V_2$ is applied to the electrodes $P_2$, $P_4$ and $P_6$, the potentials indicated by a broken line in the diagram are formed.

The carriers are, therefore, sequentially transferred in one direction (to the right in the diagram) by applying the alternating voltage to the electrodes $P_1$, $P_3$, $P_5$ and to the electrodes $P_2$, $P_4$, $P_6$ in such a manner as to have the opposite phase to each other.

On the other hand, an alternate long and short dash line in the diagram represents the potentials which are formed in the case of applying a large positive voltage $V_3$ to the electrodes. These potential wells are in the inverted states, so that the excess carriers over a predetermined quantity will have been extinguished because of recombining with the majority carriers.

FIG. 3 is a diagram showing the relationship between the electrode voltage and the shape of the internal potential as mentioned above with respect to the direction of the thickness of the semiconductor substrate 6. As shown in the diagram, the potential well is shallow with regard to the electrode voltage of $V_3$ and the excess carriers enter the second state in that they recombine with the majority carriers at the interface with the insulation layer.

On the other hand, the accumulation state as the first state occurs at the electrode voltage of $-V_1$. In this state, the majority carrier can be easily collected around the interface and, for instance, this majority carrier is supplied from a channel stopper region (not shown).

Consequently, for example, in the state in which a barrier is formed by applying the voltage $-V_1$ to the electrode $P_2$, by alternately applying the voltages $-V_1$ and $V_3$ to the electrode $P_1$, the minority carrier which is stored below the electrode $P_1$ is restricted to less than a predetermined quantity.

However, such an image sensor using charge recombination has a drawback that a clock signal for the recombination is mixed with an output signal and becomes noise.

In addition, in order to effectively extinguish the excess carriers, the accumulation state and inversion state are alternately formed at a high speed in the semiconductor substrate during the accumulation interval, thereby causing a problem of large electric power consumption. There is also a problem that in the case where such pulse control is performed at a high speed, the noise due to this pulse is mixed with the signal.

FIGS. 4A and 4B are diagrams for explaining such problems. In the diagrams, reference numeral 100 denotes a part of a driver circuit which will be explained below. This driver circuit 100 supplies a drive pulse (hereinbelow, referred to as an AB pulse $\phi_{AB}$) at predetermined P(peak)−P(peak) levels of $-V_1$ and $V_3$ in response to a timing of a pulse $\Psi_{AB}$ from a clock generator mentioned later.

Reference numerals 101 and 109 represent differentiating capacitors; 102 and 108, biasing diodes; 104 and 107, transistors; 103 and 106, smoothing capacitors; and 105, a capacitor.

FIG. 4B is a diagram showing waveforms in the respective sections. The operation of the circuit of FIG. 4A will now be described with reference to FIG. 4B.

As shown in FIG. 4B, when the pulse $\Psi_{AB}$ is inputted, the transistor 107 is turned on in response to the leading edge of this pulse, so that a current $i_{AB}$ flows from the capacitor 105 toward the power source $-V_1$ and the power source $-V_1$ is applied to and charges the capacitor 105.

In addition, the transistor 104 is turned on in response to the leading edge of the pulse $\Psi_{AB}$, so that the voltage of the power source $+V_3$ is applied to and charges the capacitor 105 and to this voltage $V_3$. In this case, since the capacitance of the capacitor 105 is equivalent to the input capacitance of several thousands of PF (picofarads), if the pulse at the voltage levels of $-V_1$ and $V_3$ (hereinbelow, referred to as the AB pulse $\phi_{AB}$) is supplied, a differentiation current of the order of a few A (amperes) will have flowed instantaneously. When this current flows through the silicon substrate of the image sensor, noise of several tens of mV (millivolts) (referred to hereinafter as the AB noise) will have been eventually caused since the resistance of the silicon substrate has a value of several tens of mΩ (milliohms). To reduce this noise, a method is considered wherein the absolute value of the differentiation current is made small by making the resistance of the silicon substrate small or by making smooth the leading and trailing characteristics of the AB pulse. However, the AB noise at a few mV remains even due to those methods.

On the other hand, a standard level of a signal which is generated from an image sensor is ordinarily several hundreds of mV, and a general video signal level likewise reaches a value of the order of about 100 mV in the case where the dynamic range during image pickup operation is set to a value which is about four times the standard signal level.

Consequently, in an ordinary movie image pickup mode, particularly, in the case of a dark subject, the foregoing AB noise reaches a level of an order at which it cannot be ignored and appears on the display.

In an output signal of an image sensor, the signal corresponding to the portion OB, which is optically shielded from the light, is generally clamped as an optical black reference signal by a DC reproducing circuit called a clamp circuit. When a pulse is supplied for the interval of this optical black reference signal, the AB noise is added to the optical black reference signal. Thus, the clamping of this signal causes a variation in clamp potential due to the AB noise. This variation results in the low frequency noise like a line on the display and causes the image quality to be remarkably deteriorated.

Although the variation ratio by the clamp potential is not determined merely by the ratio between the foregoing standard signal level (100 mV) and the level of the AB noise (a few mV), it has been confirmed that the noise at several tens of mV as a level of the NTSC signal remains even when consideration is taken of the clamp effect, gamma characteristic or the like. Such phenomenon is particularly remarkable in the case: where the AB pulse $\phi_{AB}$ is a synchronous with the TV synchronizing signal (for example, horizontal synchronizing signal); where the repetitive period of the AB pulse is changed in dependence upon a luminance level or the like of a subject; where the phases of the clamp pulse and of the AB noise vary, or the like. In this case, there is a drawback such that the luminance level changes for a several H (exposure value) few.

SUMMARY OF THE INVENTION

It is an object of the present invention to provide an image sensing apparatus with a simple arrangement in which the foregoing conventional technology is further improved.

A specific object of the present invention is to provide an image sensing apparatus which can be commonly used in the movie and still modes.

Another object of the invention is to provide an image sensing apparatus with less noise and less electric power consumption.

Still another object of the invention is to provide an image sensing apparatus which can perform an accurate clamping operation that can eliminate the drawbacks of the foregoing technology.

Still another object of the invention is to provide an image sensing apparatus with less mixture of the AB noise and less electric power consumption in which a high blooming prevention effect is obtained.

Still another object of the invention is to provide an image sensing apparatus which can effectively suppress deterioration of the video signal due to the AB noise.

According to an embodiment of the present invention, the recombination capability for the image forming interval is raised while a still image is being formed, so that blooming of the still image can be stably prevented. In the case of forming a movie image, the recombination capability for the image forming interval is reduced, so that the noise upon readout operation can be decreased.

In this way, according to this embodiment of the invention, the pulse $\phi_{AB}$ is made operative only for the horizontal blanking interval even within the accumulation interval, so that a high power saving effect is derived and the noise is inconspicuous.

The recombination is performed for almost the whole interval within the horizontal blanking interval and for the first additional interval immediately before that interval and for the second additional interval, shorter than the first, which follows immediately after the horizontal blanking interval. Therefore, no noise is added to the signal read out from the image sensor and a high power saving effect is obtained. Further, no noise appears on the screen of a receiver and a high blooming prevention effect is derived.

According to an embodiment of the invention, although a dark current noise in the still mode slightly increases, the interlace can be executed with less number of pixels in the movie mode; consequently, the still mode and movie mode can be realized with a simple arrangement.

Other objects and features of the present invention will be apparent from the following detailed description in conjunction with the accompanying drawings.

BRIEF DESCRIPTION OF THE DRAWINGS

FIG. 8 is a drive timing chart in the movie mode of the image sensing apparatus of the invention;

DETAILED DESCRIPTION OF THE PREFERRED EMBODIMENTS

The present invention will now be described hereinbelow with respect to an embodiment.

Figure 1:
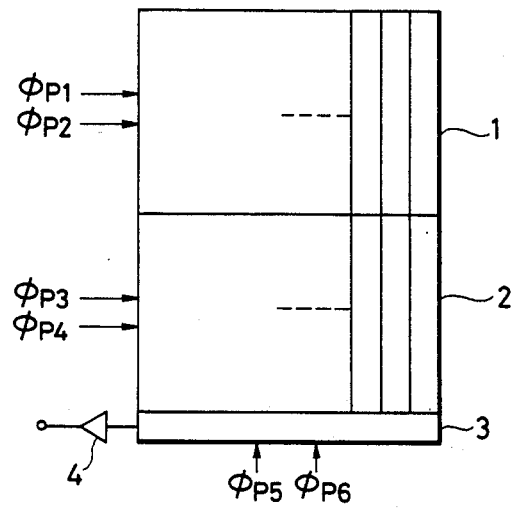
FIG. 1 is a diagrammatical view of a conventional CCD image sensor.
Figure 2:
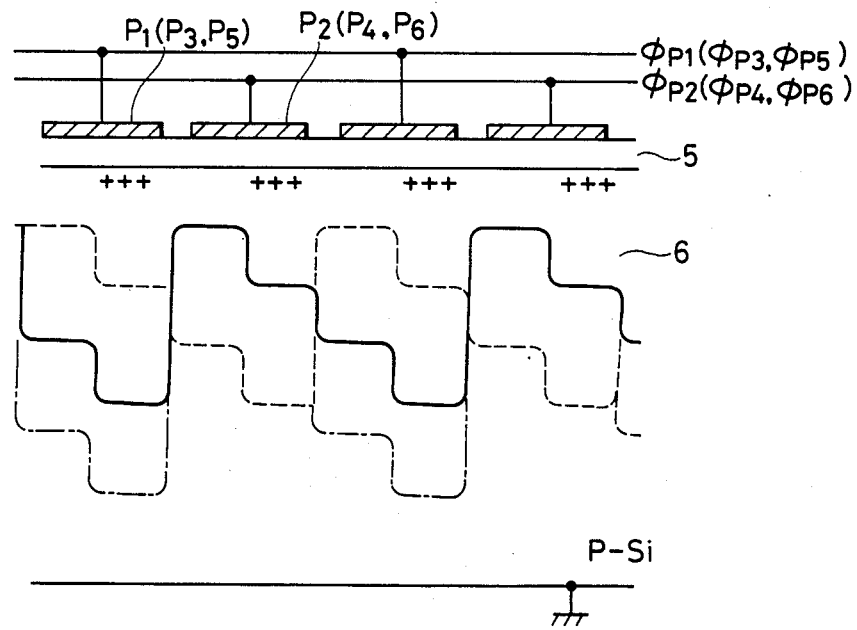
FIG. 2 is a diagram for explaining a method of driving the sensor shown in FIG. 1.
Figure 3:
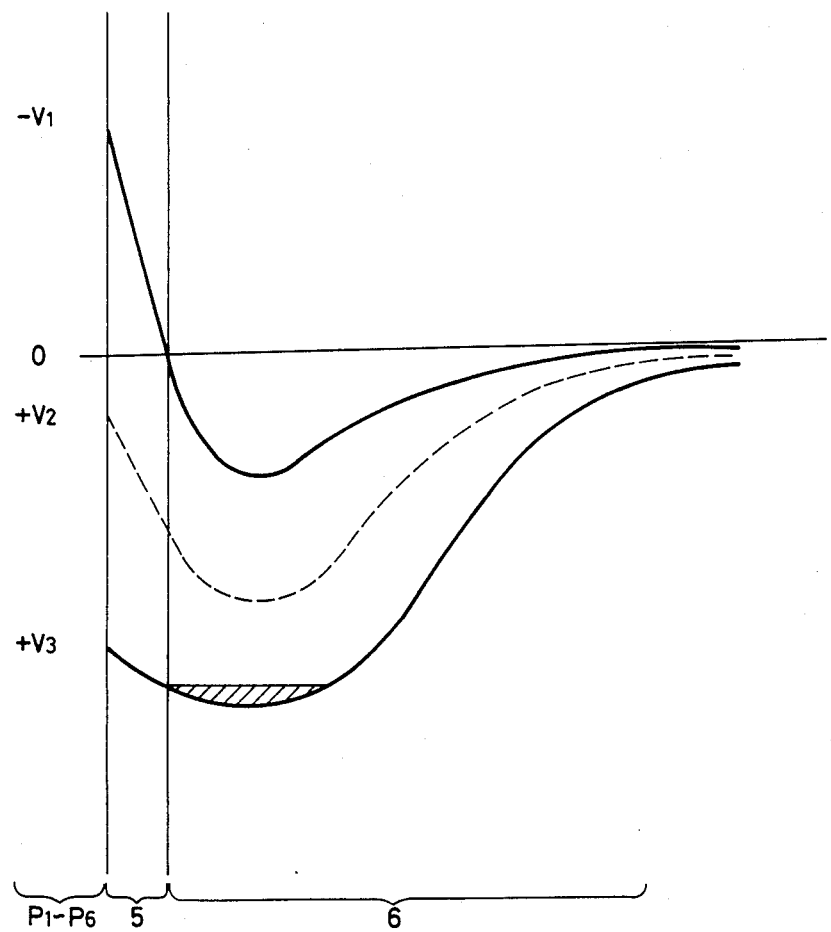
FIG. 3 is a diagram for explaining the principle of surface recombination of charges.
Figure 4A:
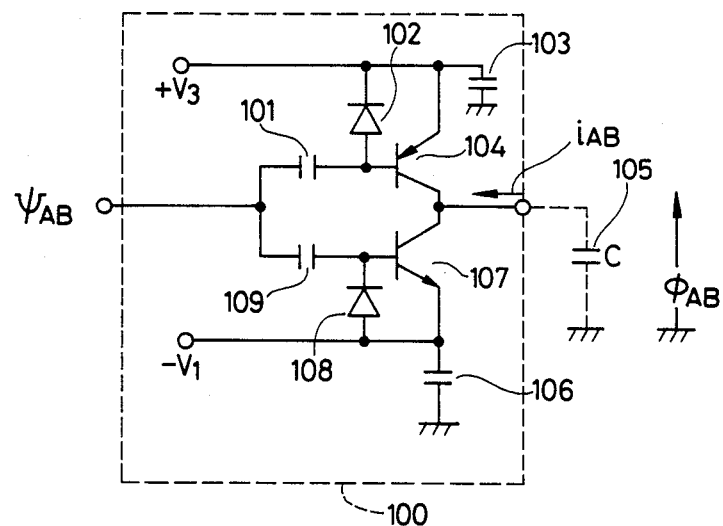
FIG. 4A is an arrangement diagram of a conventional clock driver.
Figure 4B:
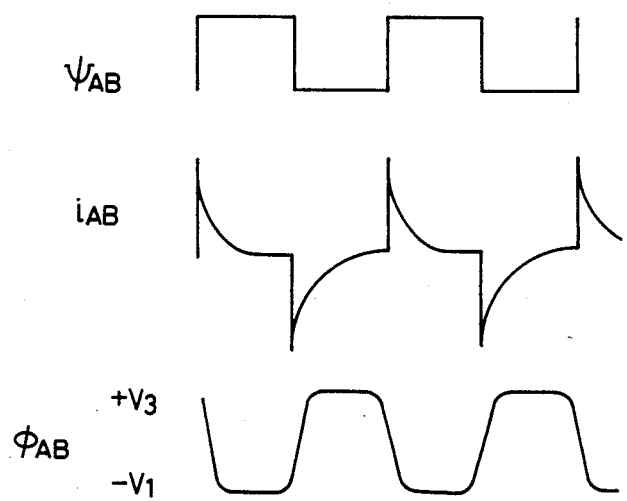
FIG. 4B is a diagram showing waveforms of the clock driver of FIG. 4A.
Figure 5:
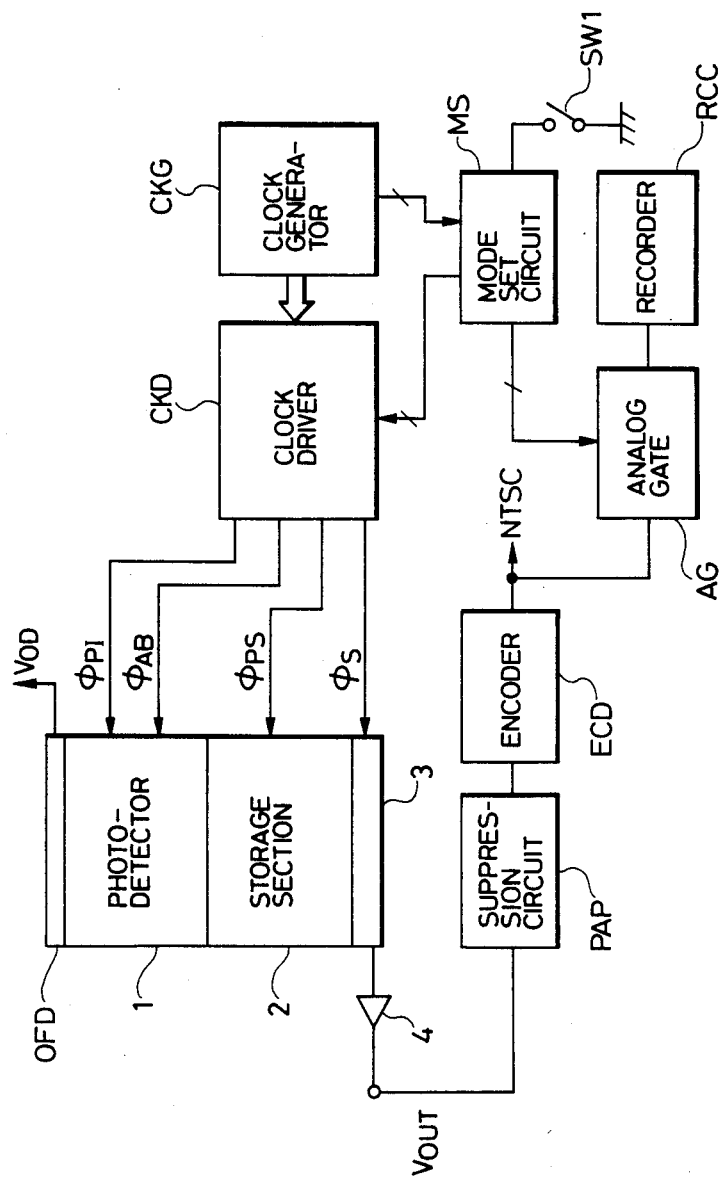
FIG. 5 is a diagram showing an example of an arrangement of an image sensing apparatus of the prevent invention.

FIG. 5 is a diagram showing an example of an image sensing apparatus using an image sensor according to the present invention. In this embodiment, a case of a frame transfer type CCD of the single phase drive system will be explained.

In the diagram, the parts and components like those shown in FIGS. 1 to 4 are designated by the same reference numerals.

OFD denotes an overflow drain which is provided in the photodetector 1 on the side opposite to the storage section 2. This overflow drain OFD serves to drain the excess charges and is biased by a constant positive voltage $V_{OD}$.

In this embodiment, together with a transfer clock $\phi_{PI}$, the clock $\phi_{AB}$ is applied to the photodetector 1 to extinguish the excess charges by recombining them with the holes at the central region of the surface recombination.

Clocks $\phi_{PS}$ and $\phi_S$ for transfer of charges are applied to the storage section 2 and horizontal shift register 3, respectively.

CKD denotes a clock driver as control means for supplying those clock pulses $\phi_{PI}$, $\phi_{AB}$, $\phi_{PS}$, $\phi_S$, etc. to the image sensor; CKG is a clock generator for generating timing signals to form those pulses; PAP a suppression circuit; and ECD an encoder. A video signal obtained through the suppression circuit PAP is converted to a signal based on the standard television system such as, e.g., NTSC signal, by the encoder ECD.

MS represents a mode set circuit to change over the output states of various kinds of pulses from the clock driver CKD. This mode set circuit MS can switch the frequency of the clock $\phi_{AB}$ for recombination and also controls the opening/closing of an analog gate AG.

RCC is a recorder. SW$_1$ is a switch serving as instructing means for allowing a still signal to be formed and recorded. When this switch is turned on, the mode set circuit is automatically set into the still mode as will be explained later, thereby controlling the clock driver CKD and opening the gate AG for one field or one frame interval at predetermined timings.

Figure 6:
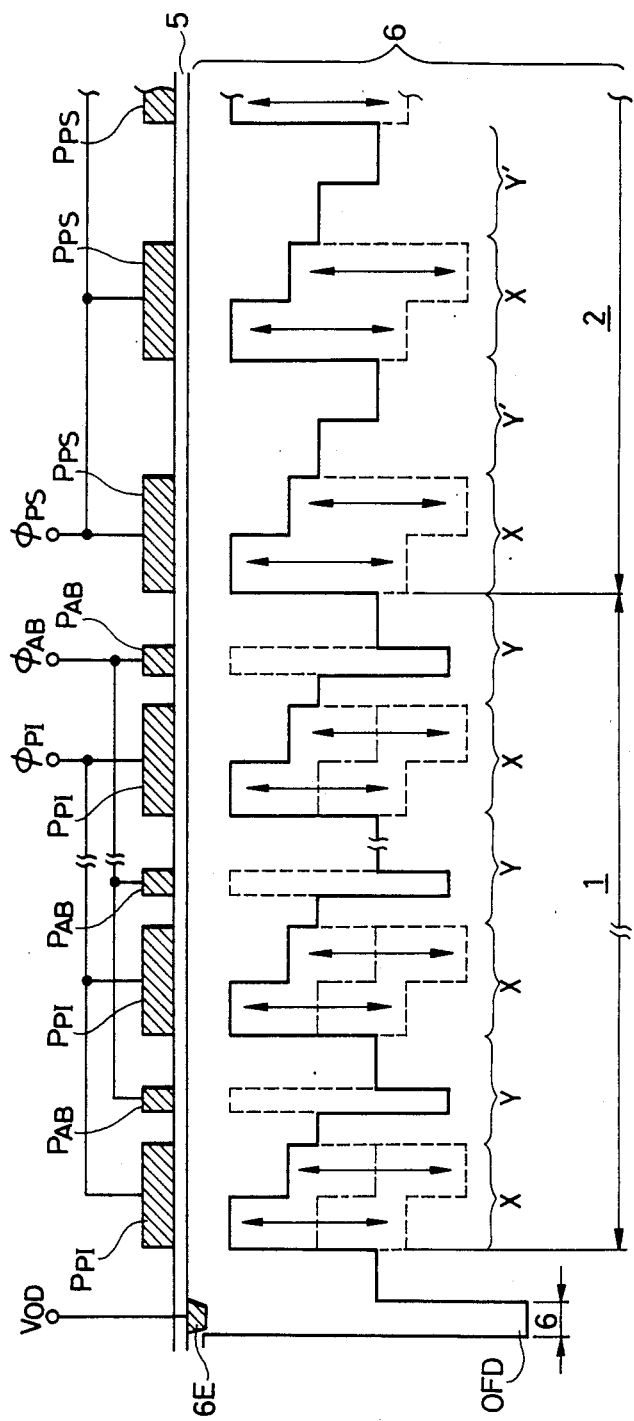
FIG. 6 is a cross sectional diagrammatical view showing an example of a structure of an image sensor suitable for use in the image sensing apparatus of the present invention.

FIG. 6 is a schematic diagram showing cross sectional structures of the electrodes and potentials in the boundary region between the photodetector 1 and the storage section 2.

In the diagram, P$_{PI}$ denotes a transfer electrode to apply the transfer clock $\phi_{PI}$ of the photodetector; P$_{AB}$ is a recombination control electrode serving as recombining means for applying the recombination clock $\phi_{AB}$; P$_{PS}$ a transfer electrode to apply the transfer clock $\phi_{PS}$ of the storage section; and 6E an n$^+$ region constituting the overflow drain.

In the case where a low level voltage is applied as the $\phi_{PI}$ and $\phi_{PS}$ and a high level voltage is applied as the $\phi_{AB}$, the potential state becomes as indicated by a solid line in the diagram. When the high level voltage is applied as the $\phi_{PI}$ and $\phi_{PS}$ and the low level voltage is applied as the $\phi_{AB}$, the potential state becomes as indicated by a broken line.

Potential stairways as shown in the diagram are formed in the substrate 6 by ion implantation. In addition, although not shown, for example, a p type inversion layer to constitute a virtual electrode is formed in the lower portion of the insulation layer which is not covered by the electrodes P$_{PI}$, P$_{PS}$ and P$_{AB}$, namely, in the boundary portion between the insulation layer and the semiconductor substrate.

The potential in the semiconductor region which is not covered by the electrodes is, therefore, not changed by the bias voltages applied to each electrode. In the diagram, it is assumed that an X region is a first region and a Y region is a second region, respectively. As shown in the diagram, the second region includes the electrode P$_{AB}$. These designations "first" and "second" regions shall also apply to the multi-phase drive system as well as the single phase drive system.

Figure 7:
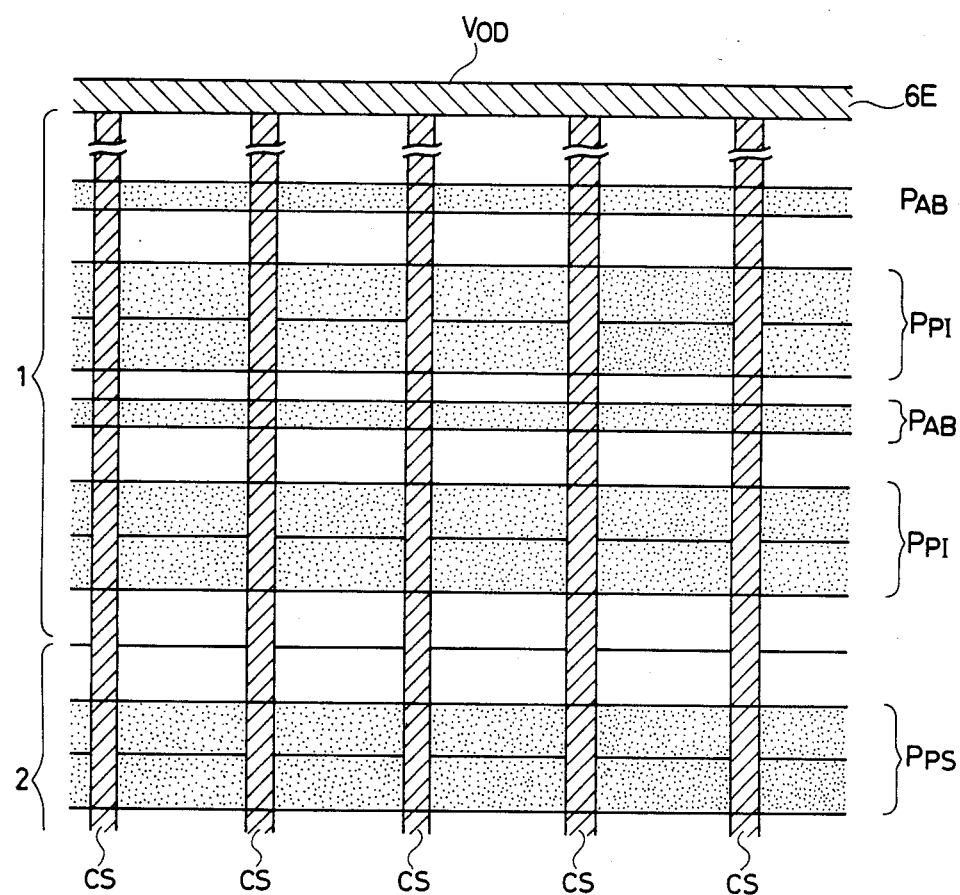
FIG. 7 is a diagram showing an example of an electrode pattern of the image sensor shown in FIG. 6.

FIG. 7 is a diagram showing an example of an electrode pattern in the regions shown in FIG. 6.

CS represents channel stops for stopping the movement of the charges in the horizontal direction.

According to the embodiment shown in FIGS. 5 to 7, the width of the electrode P$_{AB}$ for recombination of the charges can be made sufficiently smaller than the width of the transfer electrode P$_{PI}$; therefore, the efficiency of removing the excess charges can be raised.

Also, in the CCD image sensor of the single phase drive system, the charge recombining operation can be performed independently of the transfer operation.

In addition, the structure for recombination control of the image sensor in this embodiment can be formed by the step of forming polysilicon gates for electrodes which can be manufactured by the same process as the channel stops and by the ion implantation step for forming the stairways of the internal potentials.

FIG. 8 is a waveform diagram of the clock pulses $\phi_{AB}$, $\phi_{PI}$, $\phi_{PS}$, and $\phi_S$ which are generated from the clock driver CKD to drive the image sensor shown in FIG. 5 and of an output $V_{OUT}$ of the output amplifier 4, and the like when a switch SW$_1$ is turned off, that is, in the movie image pickup mode.

A vertical blanking signal $V_{BLK}$ is outputted for the intervals of t$_1$ to t$_3$ and t$_4$ to t$_6$ synchronously with a vertical sync signal $V_D$ which is obtained at every television field.

H$_{BLK}$ is a horizontal blanking signal. First, a level of the $\phi_{PI}$ is fixed to a V$_5$ level, which is nearly the intermediate level between $-V_1$ and V$_2$, during the accumulation intervals until time t$_1$, and from t$_3$ to t$_4$, and after time t$_6$. The leading or trailing of the $\phi_{PI}$ at the end of each accumulation interval is switched at every field (compare the pulses from $t_1$ to $t_3$, with those from $t$, to $t$,).

This point will now be explained. By setting the $\phi_{PI}$ at the $V_5$ level during the accumulation intervals, as shown in FIG. 9A, potential wells A and C are respectively formed in the substrate below the transfer electrode $P_{PI}$ and in the substrate below the virtual electrode, so that the charges are accumulated in the respective wells.

Figure 9A:
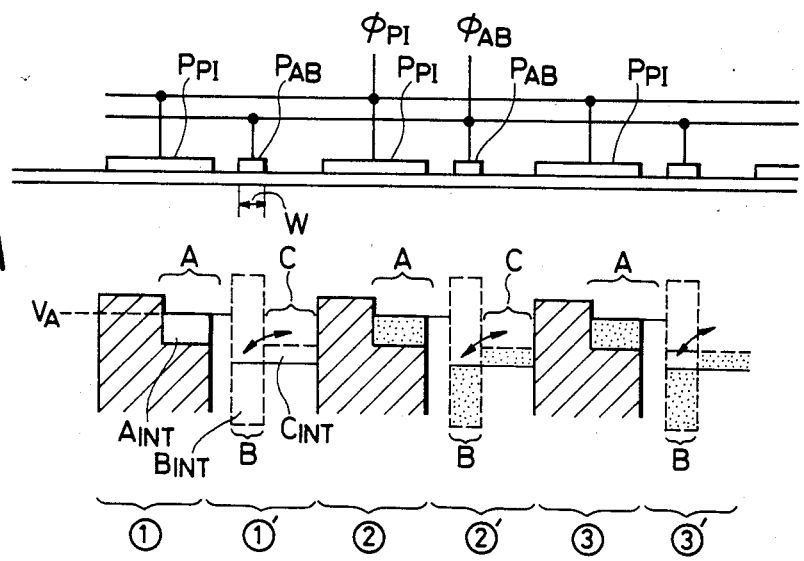
FIGS. 9A and 9B are diagrams for explaining the potential states at predetermined timings in the movie mode, respectively.

As shown in FIG. 8, a plurality of pulses $\phi_{AB}$ are supplied for each horizontal blanking interval within those accumulation intervals, so that the potential below the electrode $P_{AB}$ increases and decreases as shown in FIG. 9A. However, among the charges in the well B produced when this potential decreases, the excess charges collected near the insulation layer 5 are recombined with the holes and are extinguished when the potential increases, so that these excessive charges do not leak into the well A.

Next, by supplying a plurality of pulses $\phi_{AB}$ for the intervals of $t_1$ to $t_2$ and $t_4$ to $t_5$, the excess charges immediately before the vertical transfer are removed.

Further, clocks $\phi_{PI}$ and $\phi_{PS}$ equal in number to the respective numbers of pixels in the vertical direction of the photodetector 1 and of the storage section 2 are supplied for the intervals of $t_2$ to $t_3$ and $t_5$ to $t_6$ in such a manner that they are in phase.

Thus, the charges in each pixel in the photodetector 1 are transferred into the corresponding storage cell in the storage section and are accumulated therein.

As this time, in the present invention, the clock $\phi_{AB}$ which is applied to the recombination electrode $P_{AB}$ is fixed to a voltage level of $V_4$.

Figure 10:
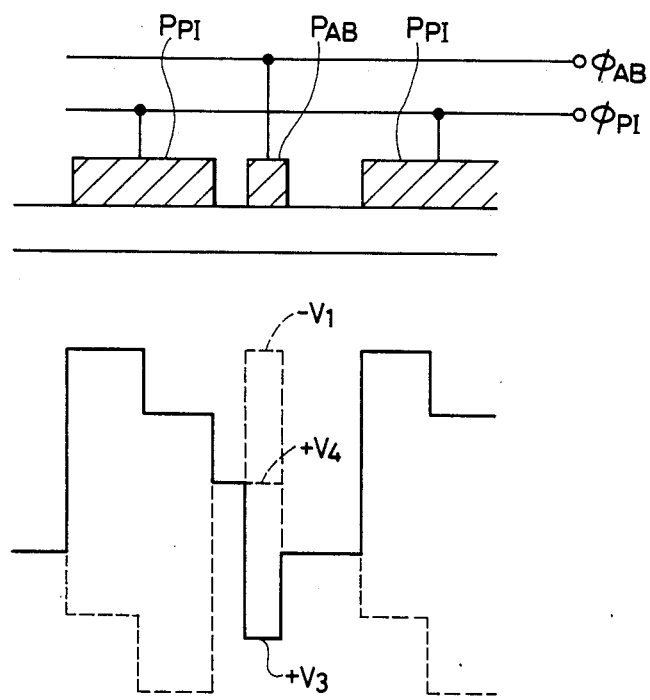
FIG. 10 is a diagram for explaining the potential below the electrode $P_{AB}$.

This voltage $V_4$ has a voltage value such that, for example, as shown in FIG. 10, the potential level below the electrode $P_{AB}$ locates between the upper limit and the lower limit of the potential level of the virtual electrode section.

As described before, the leading or trailing of the $\phi_{PI}$ at the end of each accumulation interval is switched at every field.

Figure 9B:
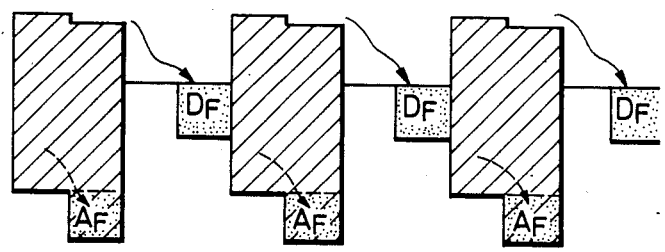

That is, it is assumed that the quantities of charges which are stored in the wells A and C (or B) during the accumulation interval until time $t_1$ in FIG. 8 at the first field are respectively $A_{INT}$ and $C_{INT}$ (or $B_{INT}$) as shown in FIG. 9A. Next, upon vertical transfer which starts from time $t_2$ in FIG. 8, as shown in FIG. 9B, by raising the $\phi_{PI}$ from the intermediate level to the $V_2$ level at the beginning of the transfer, the charges accumulated in the portions of ①' and ②, ②' and ③, ... are added and are transferred to the storage section. On the other hand, at the second field, by decreasing the $\phi_{PI}$ from the intermediate level $V_5$ to $-V_1$ at the beginning of the transfer, the charges accumulated in the portions of ① and ①', ② and ②', ③ and ③', ... are added.

· In this way, by changing the combination of charges which are added at every field, the interlacing operation is executed.

With such an arrangement, an interlacing effect can be derived with a small number of pixels, and at the same time the level of the dark current does not vary at every field and flicker is unlikely to occur.

Upon completion of the vertical transfer, the charges in the storage section are read out line by line synchronously with the horizontal period in response to the clocks $\phi_{PS}$ and $\phi_S$ during the intervals of $t_3$ to $t_4$ and after $t_6$ and are outputted as a horizontal line signal.

These intervals, $t_2$ to $t_3$ and after $t_6$ correspond to the vertical scan intervals of the standard television signal.

Figure 11:
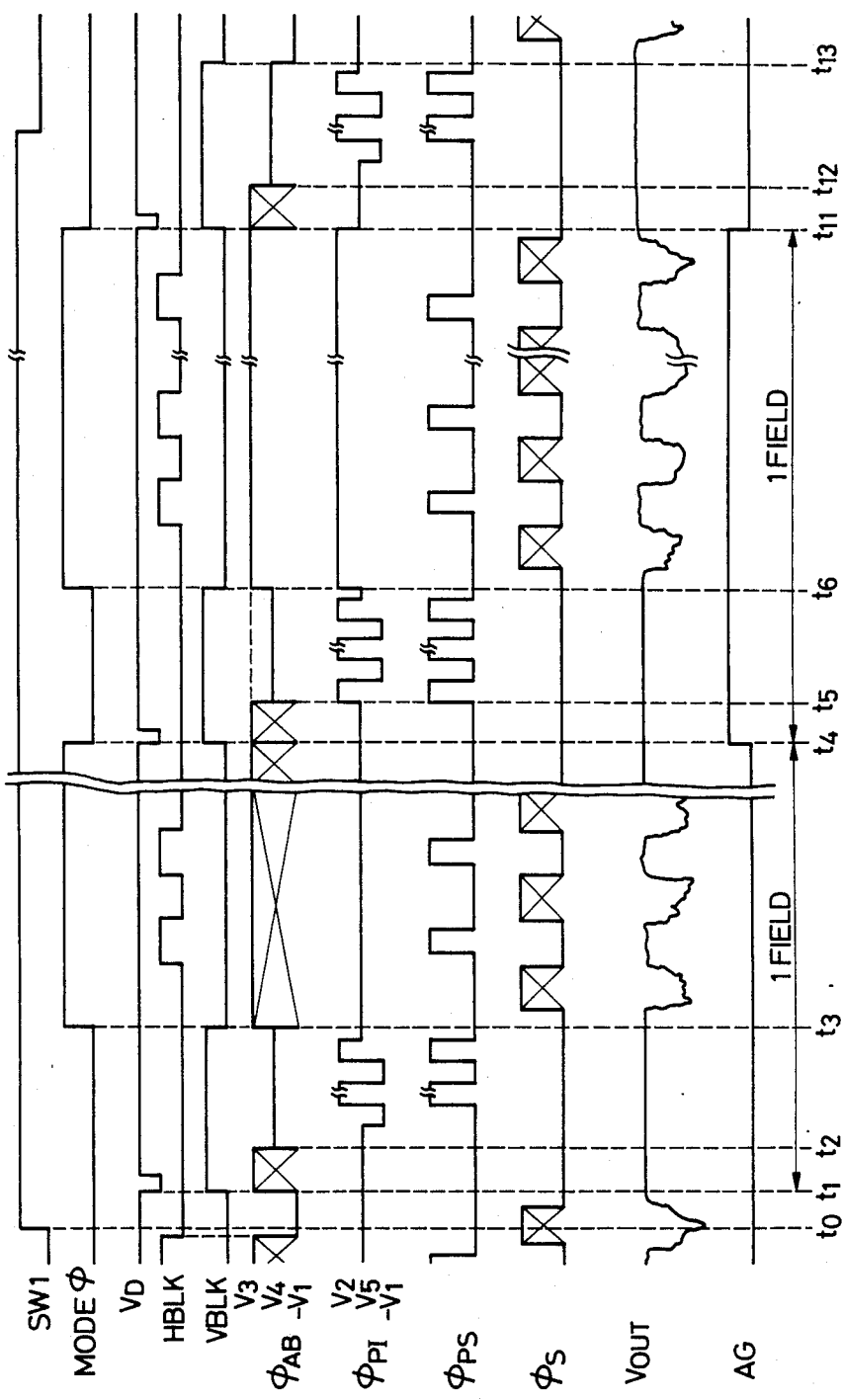
FIG. 11 is a timing chart in the still mode.

Next, FIG. 11 is a timing chart showing the case where the switch $SW_1$ is turned on to perform the image pickup in the still mode. When the switch $SW_1$ is turned on at arbitrary time $t_0$, a signal of MODE$\phi$ for use in the still mode, which will be explained later, is generated from the mode set circuit MS synchronously with the trailing edge (time $t_3$) of the next vertical blanking pulse $V_{BLK}$ and with the next trailing edge (time $t_6$).

This signal of MODE$\phi$ is held until the leading times $t_4$ and $t_{11}$ of the next vertical blanking pulse $V_{BLK}$, respectively.

The pulses $\phi_{AB}$ at the clock period are always supplied at a high speed for the interval when the signal MODE$\phi$ is outputted for the interval of $t_3$ to $t_4$.

On the other hand, the $\phi_{AB}$ is fixed to a potential $V_3$ and the $\phi_{PI}$ is fixed to the potential $v_2$ during the time when the signal MODE$\phi$ is outputted for the interval of $t_6$ to $t_{11}$. The analog gate AG is turned on for this interval.

The other pulses are similar to those shown in FIG. 8.

Therefore, the maximum capability of recombination can be utilized while the charges for one field are read out by the pulses $\phi_{PS}$ and $\phi_S$ after the switch $SW_1$ has been turned on, so that no blooming occurs in the image which is formed in the photodetector 1 during this interval.

Although vertical stripes appear on the display since the noise is added to the signal which is read out during this interval, it can be substantially ignored because those stripes appear for 1/60 second.

The image signal formed in this way is read out in response to the pulses $\phi_{PS}$ and $\phi_S$ for the interval of $t_6$ to $t_{11}$ and is recorded by the recorder RCC since the gate AG is opened during this interval.

As described above, according to this embodiment, the capability of recombination during the formation of an image in the still mode is greater than the capability of recombination during the formation of an image in the movie mode, so that the picture quality of the still image is improved. Also, the noise during the readout of the image in the movie mode can be reduced.

Further, since the $\phi_{AB}$ is supplied only for the horizontal blanking interval in the movie mode, the noise during the readout does not appear on the display.

In addition, in the embodiment, although the number of pulses of $\phi_{AB}$ during the formation of an image is controlled to control the recombining capability by the $\phi_{AB}$, for instance, the P—P value (peak-to-peak value) of the $\phi_{AB}$ may be controlled.

Practically speaking, the P—P value of the $\phi_{AB}$ may be made large during the formation of an image in the still mode, while the P—P value of the $\phi_{AB}$ may be made small in the movie mode.

In the embodiment, the number of pulses of the $\phi_{AB}$ during the formation of an image is reduced in the movie mode and the pulses $\phi_{AB}$ are supplied for the horizontal blanking interval to eliminate the noise during the readout operation. However, the pulses $\phi_{AB}$ of a lower frequency than that in the still mode may be supplied for almost the whole interval during the formation of an image in the movie mode.

The recombining capability according to the present invention includes the capability due to such P—P value, frequency or the like of the $\phi_{AB}$ as mentioned above.

On one hand, in particular, since the level of the $\phi_{AB}$ is constant for the interval of $t_6$ to $t_{11}$ during this time, no noise is added while the signal $V_{OUT}$ is being read out and electric power can be also saved.

The potential barrier in the photodetector 1 is lower than the barrier in the storage section 2 for most of this interval ($t_6$ to $t_{11}$). Namely, in FIG. 6, the potential in the region X is as indicated by the broken line and the potential in the region Y is as shown by the solid line. Consequently, even if the $\phi_{AB}$ is inoperative, the overflowed charges will hardly leak into the storage section.

In addition, since the overflow drain is provided in the photodetector 1 on the side opposite to the storage section 2, the overflowed charges in the photodetector 1 will have been drained into the power source $V_{OD}$.

The potential in the region X in the storage section decreases due to the pulse $\phi_{PS}$ only for the horizontal blanking interval. However, since the effective image signal (image signal formed until time $t_1$) is moved downwardly in FIG. 5 in the storage section 2 whenever the potential decreases, it is possible to ignore the charges which leak from the photodetector 1 while the pulse $\phi_{PS}$ is at a high level.

It should be noted that this embodiment has a feature such that, in particular, the $\phi_{PI}$ is held at the voltage level of $V_5$, which is nearly the intermediate level between $-V_1$ and $V_2$, during the accumulation intervals. Namely, in general, in the case of collecting the charges by forming the potential well by forming a depletion layer in the semiconductor substrate, noise of the dark current increases as a large reverse bias voltage is applied to the electrodes. Therefore, it is desirable to keep the potential in the region X below the electrode $P_{PI}$ in the potential state as indicated by the solid line in FIG. 6 by applying, e.g., the potential of $-V_1$ to the electrode $P_{PI}$ during the accumulation interval.

Particularly, in the still mode, in which interlace is unnecessary, it is possible to derive an image signal having a good S/N ratio be setting the voltage level of the $\phi_{PI}$ at $-V_1$ during the accumulation interval ($t_3$ to $t_4$). However, this method has the drawback that the level of the video signal largely changes in the movie and still modes or the interlace cannot be executed in the movie mode.

Figure 12A:
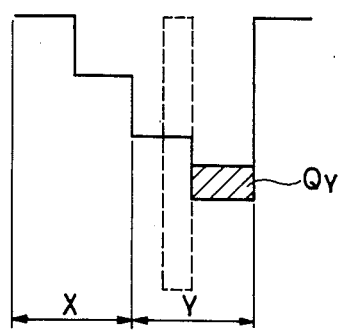
FIG. 12A is a diagram showing the potential when the pulse $\phi_{PI}$ is at $-V_1$ level.
Figure 12B:
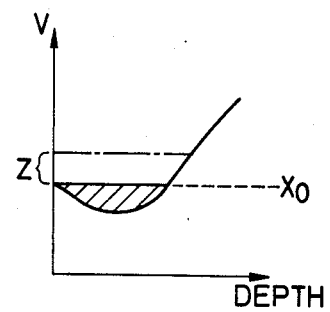
FIG. 12B is a diagram showing the potential state in the direction of the depth of the substrate at the time of FIG. 12A.

In other words, as shown in FIG. 12A, when $\phi_{PI}=-V_1$ for the accumulation interval in the still mode, the potential in the X region becomes as shown in the diagram, so that the charges remain in the well of the Y region. However, among the charges stored in the Y region, the charges up to a quantity Z exceeding a threshold level $X_0$ in FIG. 12B are recombined, so that the charges up to a quantity of $Q_y$ finally remain.

On the other hand, even in the movie mode, the $\phi_{PI}$ may be set at the level of $-V_1$ as shown in FIG. 12A for the accumulation interval to raise the recombining capability as described above. However, in this case, in order to obtain the interlaced image at every field, as many pixels as the scanning lines of two fields are needed as the pixels in the vertical direction of the photodetector 1 (a pair of elements in the X and Y regions constitute one pixel).

However, the above-mentioned method causes a drawback such that the yield of the image sensor deteriorates.

Figure 13A:
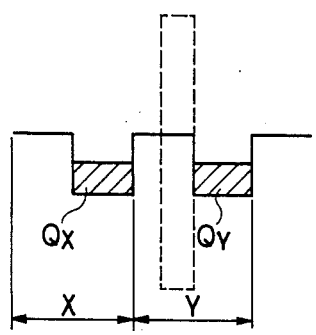
FIG. 13A is a potential diagram when the pulse $\phi_{PI}$ is at $+V_2$ level.
Figure 13B:
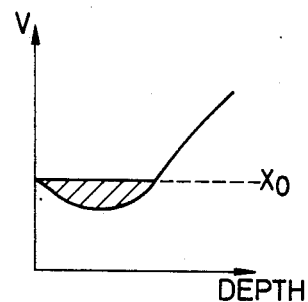
FIG. 13B is a diagram showing the potential state in the direction of the depth of the substrate at the time of FIG. 13A.

Therefore, in this embodiment, the charges are divided and stored in the X and Y regions by setting the $\phi_{PI}$ at the level of $V_5$ during the accumulation interval in the movie mode as shown in FIG. 13A as described above. Further, the interlacing effect is obtained by changing the combination in addition of the charges by leading or trailing the $\phi_{PI}$ at every field at the end of each accumulation interval.

Figure 14:
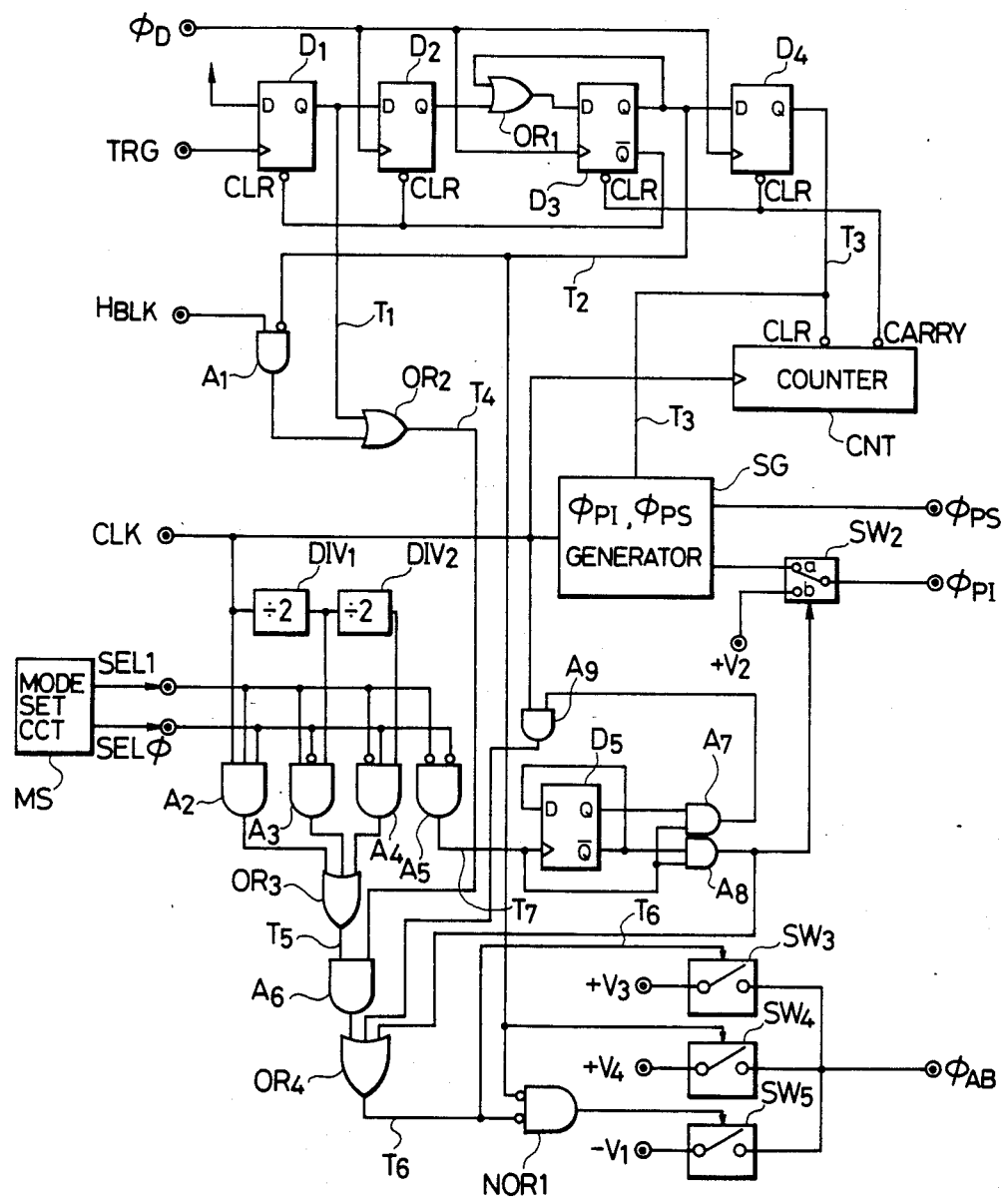
FIG. 14 is a diagram showing an example of an arrangement of a clock driver.
Figure 15:
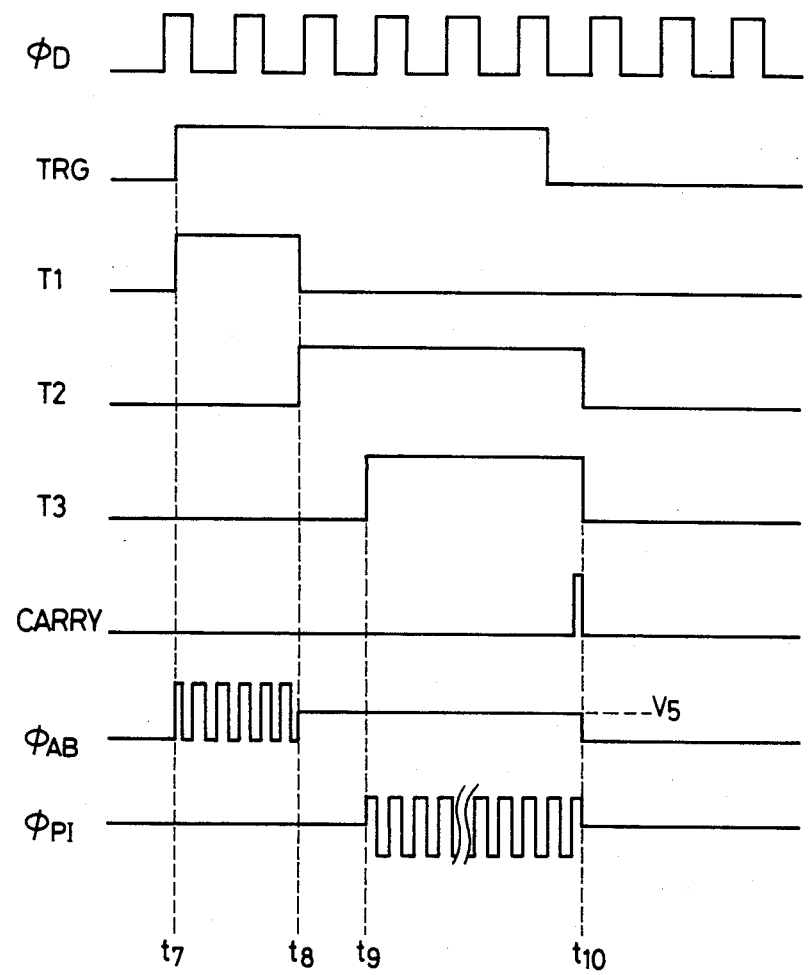
FIG. 15 is a timing chart for a part of the clock driver of FIG. 14.

FIG. 14 shows an example of an arrangement of the clock driver CKD. FIG. 15 shows a timing chart thereof. In FIGS. 14 and 15, $\phi_D$ denotes a pulse which is generated twice for one horizontal interval, and TRG is a frame transfer trigger pulse to perform the frame transfer. This pulse TRG is generally outputted for the vertical blanking interval or at a timing relative thereto.

The pulse TRG may be outputted at an arbitrary timing other than the vertical blanking interval as disclosed in, for instance, Japanese Patent Application No. 61098/1983. In this case, the image accumulation time can also be controlled in dependence upon the timing of the pulse TRG.

$D_1$ to $D_5$ denote D flip flops; $OR_1$ to $OR_4$ are OR gates; CNT a counter; SG a pulse generator for producing the $\phi_{PI}$ and $\phi_{PS}$; $SW_2$ to $SW_5$ analog switches; $DIV_1$ and $DIV_2$ ½ frequency dividers; $A_1$ to $A_9$ AND gates; and $NOR_1$ a NOR gate.

The D flip flop $D_1$ receives the pulse TRG as a clock and its intput D is always at a high level, so that an output $T_1$ becomes a high level due to the trigger (at time $t_7$) in response to the pulse TRG.

Thus, an output $T_2$ is generated (at time $t_8$) after the delay time corresponding to the two clocks $\phi_D$ due to the D flip flops $D_2$ and $D_3$. In response to the output $T_2$, the flip flop $D_1$ is cleared and the output $T_1$ becomes a low level. The duration of the interval when the output $T_1$ is at a high level can be reduced or increased by increasing or decreasing the number of D flip flops. In this embodiment, the interval of $t_7$ to $t_8$ is set to one horizontal interval, but it the flip flop $D_2$ is omitted, it becomes the interval of ½ H. After the output $T_2$ became a high level, an output $T_3$ of the D flip flop $D_4$ becomes a high level at time $t_9$ and after predetermined clocks, the flip flops $D_3$ and $D_4$ are cleared (at time $t_{10}$) in response to an output CARRY of the coutner CNT and the outputs $T_2$ and $T_3$ become a low level, then the frame transfer is finished.

Since the $\phi_{PI}$, $\phi_{PS}$ and the like can be generated from the generator SG as shown in FIG. 8, they are not shown here in particular.

The horizontal blanking signal $H_{BLK}$ passes through the AND gate $A_1$, so that it is held at a low level while the output $T_2$ is at a high level. An output of the AND gate $A_1$ is inputted to the OR gate $OR_2$, by which OR of the output of the AND gate $A_1$ and the output $T_1$ of the D flip flop $D_1$ is obtained, so that the output $T_4$ is generated from the OR gate $OR_2$.

Thus, the output $T_4$ becomes a high level for either interval of the horizontal blanking interval excluding the vertical transfer interval of $t_8$ to $t_{10}$ and the interval of $t_7$ to $t_8$ when the output $T_1$ is at a high level, which corresponds to the interval immediately before the output $T_2$ is generated.

A clock signal CLK, frequency dividing signals of the frequency dividers $DIV_1$ and $DIV_2$, and an output of the mode set circuit MS are supplied to the AND gates $A_2$ to $A_5$, respectively, and the following relations are satisfied among them.

Namely, when outputs $SEL_1$ and $SEL\phi$ from the mode set circuit MS are at a high level H (hereinbelow, referred to as MODE3), the clock CLK is outputted as it is as an output $T_5$ of the OR gate $OR_3$. When $SEL_1=H$ and $SEL\phi=L$ (hereinafter, referred to as MODE2), the output $T_5$ becomes the $\frac{1}{2}$ frequency divided output of the clock CLK.

On the other hand, when $SEL_1=L$ and $SEL\phi=H$ (hereinbelow, referred to as MODE1), the output $T_5$ becomes the $\frac{1}{4}$ frequency divided output of the clock CLK. When $SEL_1=L$ and $SEL\phi=L$ (hereinafter, referred to as MODE$\phi$), the AND gate $A_5$ always outputs a signal at an H level.

In addition, the output $T_1$ is the timing pulse to supply the $\phi_{AB}$ immediately before the vertical transfer and the $\phi_{AB}$ is supplied when the $T_1$ is at a high level.

The output $T_3$ is the timing pulse for the vertical transfer and the vertical transfer is performed due to the $\phi_{PI}$ and $\phi_{PS}$ when the $T_3$ is at a high level.

In the movie mode, in which the switch $SW_1$ shown in FIG. 5 is disconnected, the period of the $\phi_{AB}$ is determined in accordance with one of the modes MODE1 to MODE3 selected by the mode set circuit and the $\phi_{AB}$ is supplied at timings as shown in FIG. 8.

Also, the $\phi_{PI}$ and $\phi_{PS}$ are generated from the pulse generator SG. These pulses are generated at timings as shown in FIG. 8.

When the switch $SW_1$ is once connected, the output of the mode set circuit MS becomes MODE$\phi$ immediately after that, so that the $SEL_1=L$ and $SEL\phi=L$ and an output $T_7$ of the AND gate $A_5$ becomes a high level.

The flip flop $D_5$ is made operative in response to the leading edge of the output $T_7$. Now, assuming that the initial state is set such that $Q=L$ and $\overline{Q}=H$, an output $Q$ of the flip flop $D_5$ is held at a high level until the leading time $t_6$ of the next output $T_7$. Thus, the AND gate $A_7$ outputs a high level signal and the AND gate $A_8$ outputs a low level signal for the interval of $t_3$ to $t_4$.

On the other hand, the AND gate $A_7$ outputs a low level signal and the AND gate $A_8$ outputs a high level signal for the interval of $t_6$ to $T_{11}$. The AND gate $A_9$ leads the clock signal CLK to the OR gate $OR_4$ while the gate $A_7$ outputs a high level signal, so that the switch $SW_3$ is closed when the clock CLK is at a high level and the $\phi_{AB}$ is set at $+V_3$. The switch $SW_5$ is closed when the clock CLK is at a low level and the $\phi_{AB}$ is set at $-V_1$.

The NOR gate $NOR_1$ is open when the output $T_2$ is not at a high level. When the $T_2$ is at a high level, the switch $SW_4$ is closed and the $\phi_{AB}$ is fixed to $+V_4$. In addition, since the $\phi_{AB}$ is supplied at a high speed when the $T_1$ is at a high level immediately before the $T_2$ becomes a high level, the smear or blooming can be prevented. Also, the AND gate $A_8$ outputs a high level signal for the interval of $t_6$ to $t_{11}$, so that the switch $SW_3$ is closed during this interval and the $\phi_{AB}$ is set to the potential of $V_3$. The analog switch $SW_2$ is switched to the side of b for this interval and the $\phi_{PI}$ is fixed to the potential of $+V_2$.

As described above, in this embodiment, the pulses $\phi_{AB}$ are supplied for a predetermined time immediately before the frame transfer interval and the excessive charges immediately before the transfer are removed; consequently, no smear or blooming occurs.

In case of recording a video output from the image sensor only at one field or one frame, a number of pulses $\phi_{AB}$ are always supplied at a high speed during a predetermined interval of formation of an image and the $\phi_{AB}$ is held at a constant potential while this formed image is recorded, so that electric power can be saved and no noise is mixed. Further, the blooming can be stably eliminated during the formation of an image.

Although an example of the frame transfer type CCD of the single phase drive system has been described above, it is obvious that the present invention can be also applied similarly to a CCD image sensor using the multi-phase drive system. It is apparent that the invention can be applied to all of the image sensors of the type in which an image signal is converted to charges and stored and is not limited to the CCD image sensor. On one hand, although the foregoing embodiment is constituted in a manner such that an image corresponding to one field interval is recorded in the still mode, the invention can be also applied to a system in which an image corresponding to two fields is formed and recorded. In that embodiment, it is set such that the $\phi_{PI}=V_2$ and $\phi_{AB}=V_3$ during the mode of MODE$\phi$, but even when $\phi_{PI}=V_5$ and $\phi_{AB}=V_4$, the potential barrier in the photodetector is lower than the barrier in the storage section, so that a similar effect is derived. In that embodiment, the potential levels of not only the $\phi_{AB}$ but also the $\phi_{PI}$ can be controlled due to the signals $SEL_1$ and $SEL\phi$ from the mode set circuit; therefore, the number of input pins of the clock driver can be reduced.

As described above, according to the present invention, since the recombining capability for the image forming interval is raised while a still image is formed, the blooming of the still image can be stably prevented. In the case of forming a movie image, the recombining capability for the image forming interval is reduced, so that the noise upon readout operation can be decreased.

As described above, by setting the $\phi_{PI}$ to $+V_4$ during the accumulation in the movie mode, the interlacing effect is obtained. In this case, the charges are stored in the X and Y regions as shown in FIG. 13A, respectively. A quantity of charges which finally remain in the Y region due to the recombination is $Q_Y$ similarly to the case of FIG. 12A. However, they are added to the charges of a quantity of $Q_X$ in the X region in FIG. 13A upon the vertical transfer for the interval of $t_2$ to $t_3$ or $t_5$ to $t_6$ in FIG. 8; thus, a total quantity of signal which is read out through the storage section 2 becomes almost twice that in the case of FIG. 9A.

Therefore, there is a drawback such that the operating point of the signal processor for processing the output signal of the image sensor in both still and movie modes largely changes as mentioned above.

To prevent this, in this embodiment, the $\phi_{PI}$ is set at the level of $V_5$ for the accumulation interval ($t_3$ to $t_4$) in the still mode as mentioned before, so that the arrangements of the circuits (PAP, ECD, etc. in FIG. 5) for processing the output signal at the post stage are simplified and an effect such that the image pickup can be performed in the movie mode is also derived.

Figure 16:
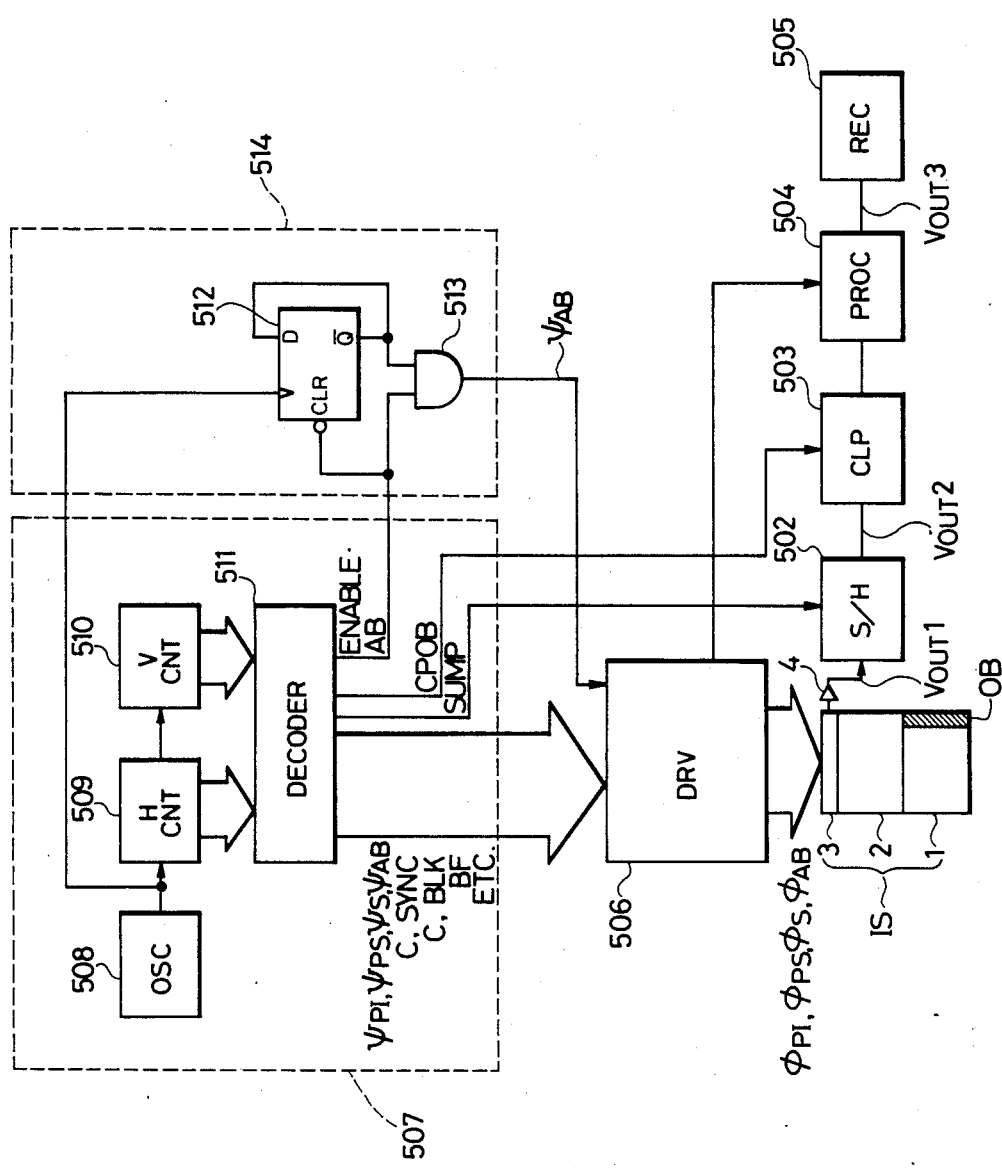
FIG. 16 is a diagram showing the second preferred embodiment of an image sensing apparatus of the present invention.

FIG. 16 is a diagram showing the second embodiment of an image sensing apparatus using an image sensor according to the present invention. In this embodiment, the case where the frame transfer type CCD of the single phase drive system is used will be explained.

In the diagram, the similar parts and components as those shown in FIGS. 1 to 15 are designated by the same reference numerals. IS denotes a CCD image sensor as image sensing means. In this embodiment, together with the transfer clock $\phi_{PI}$, the AB pulse $\phi_{AB}$ is applied to the photodetector 1 in order to extinguish the excessive charges by recombining them with the holes at the center of the surface recombination.

The clocks $\phi_{PS}$ and $\phi_S$ for transfer are applied to the storage section 2 and horizontal shift register 3, respectively.

A reference numeral 506 denotes a driver circuit serving as readout means for supplying the foregoing transfer pulses $\phi_{PI}$, $\phi_{PS}$ and $\phi_S$ which are necessary for the transfer by the CCD image·sensor and the above-mentioned AB pulse $\phi_{AB}$. A numeral 507 is a first clock generator for producing timing signals $\Psi_{PI}$, $\Psi_{PS}$ and $\Psi_S$ for the pulses $\phi_{PI}$, $\phi_{PS}$ and $\phi_S$ in those pulses.

A numeral 514 is a second clock generator serving as recombination control means. In response to the timing signal $\Psi_{AB}$ from the clock generator 514, the driver circuit 506 produces the AB pulse $\phi_{AB}$ and supplies it to the electrode $P_{AB}$ of the image sensor, which will be mentioned later.

A numeral 508 is a reference oscillator; 509 a horizontal clock counter for counting output pulses from the oscillator 508 and forming a horizontal sync signal and the like; and 510 a vertical clock counter for counting the horizontal sync signal as an output of the horizontal clock counter 509 and outputting vertical sync signal and the like.

A numeral 511 is a decoder for outputting various kinds of timing pulses in accordance with the output states of the counters 509 and 510.

Namely, the decoder 511 generates a composite sync signal C.Sync, a composite blanking signal C.BLK, and timing signals for the transfer pulses $\phi_{PI}$, $\phi_{PS}$, $\phi_S$, etc. and supplies them to the driver circuit 506.

In addition, the decoder 511 together with an AND gate 513 constitutes inhibiting means according to the present invention.

Figure 17:
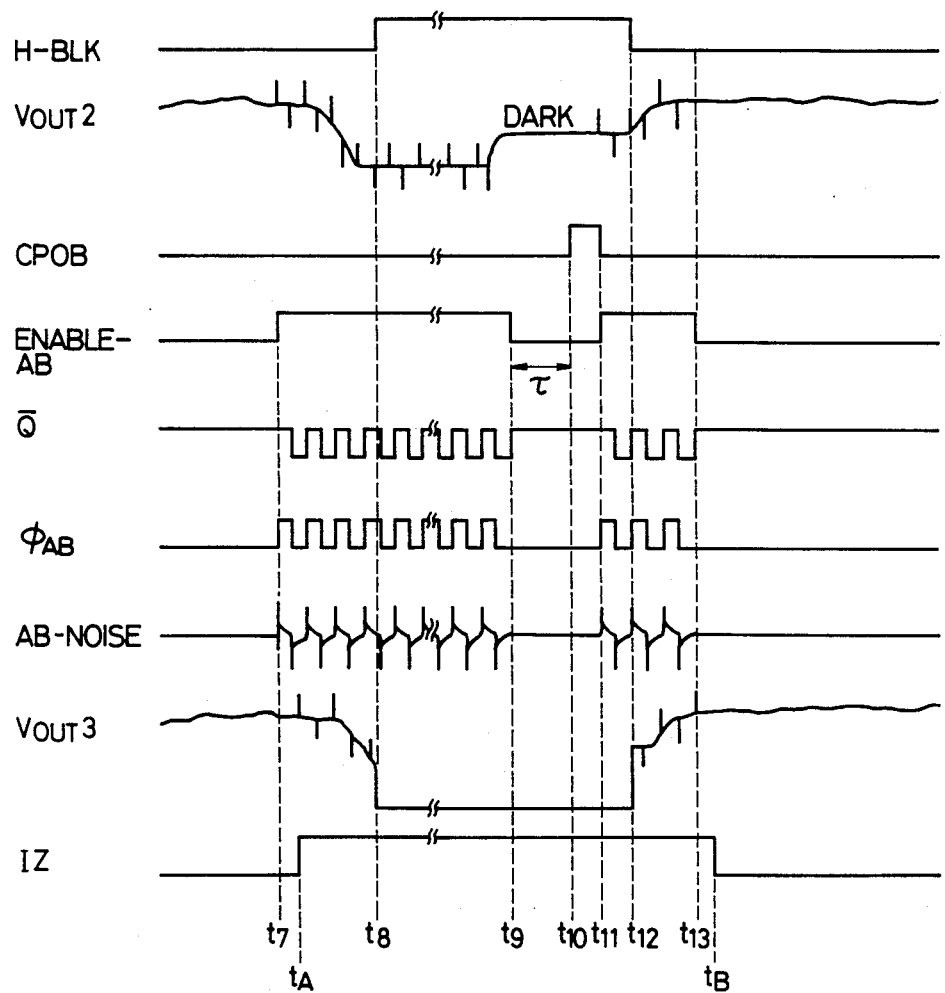
FIG. 17 is an output timing chart of a clock driver according to the second embodiment.

Practically speaking, by outputting an ENABLE-AB signal at a low level at a timing as shown in FIG. 17, an output of the second clock generator is inhibited. A numeral 512 is a D flip flop, which forms a frequency divider by inputting a $\overline{Q}$ output to a D input terminal of itself.

An output of the oscillator 508 is inputted to a clock input of the D flip flop 512.

In addition, AND of the $\overline{Q}$ output of the flip flop 512 and the ENABLE-AB signal is formed as the timing pulse $\Psi_{AB}$ by the AND gate 513.

The decoder 511 outputs a clamp pulse CPOB to a clamp circuit 503 which will be explained later at a timing as shown in FIG. 17. The clamping operation is performed when the clamp pulse CPOB is at a high level.

The decoder 511 also outputs a sampling pulse SUMP synchronized with the horizontal transfer clock of the image sensor IS to a sample and hold circuit 502.

On one hand, among the outputs of the driver circuit 506, the composite sync signal C.Sync, composite blanking signal C.BLK and the like are supplied to a processor 504.

An output of the processor 504 is supplied to a recorder 505.

FIG. 17 is a diagram showing detailed operation timings of the circuit shown in FIG. 16.

A dot sequential signal which is read out from the image sensor IS is sequentially sampled and held in the sample and hold circuit 502, thereby extending a duty ratio of this dot sequential signal. Therefore, an output Vout2 of the sample and hold circuit 502 becomes as shown in FIG. 17. An output of the optical black portion OB of the image sensor IS is derived in a back porch for the horizontal blanking interval H-BLK.

The output of the sample and hold circuit 502 is clamped by the clamp circuit 503 in response to the clamp circuit 503 is subjected to the corrections such as the gamma correction, aperture correction, etc. in the processor 504, and at the same time it is mixed to the composite sync signal and composite blanking signal and thereafter it is supplied to the recorder 505.

In the embodiment, the AB pulse $\phi_{AB}$ is cut by the output ENABLE-AB of the decoder 511 serving as the inhibiting means at least for the interval ($t_{10}$ to $t_{11}$) when the output of the clamp pulse CPOB is at a high level, namely, while the clamping operation is executed, and the constant potential of $-V_1$ is supplied.

Therefore, there is not a fear such that the clamp level varies due to the noise (AB-NOISE in FIG. 17) which is caused in association with the supply of the pulse $\phi_{AB}$.

In addition, in this embodiment, the variation in the AB pulse $\phi_{AB}$ is prohibited for the interval from early timing $t_9$ which is precedent by only time $\tau$ from timing $t_{10}$ when the clamp pulse CPOB becomes a high level until time $t_{11}$ when the clamp is finished. The reason of this inhibition is to prevent the trailing portion of the AB noise from being mixed with the video signal upon clamping.

Further, in this embodiment, the AB pulse is applied for the interval of $t_7$ to $t_{13}$ which exceeds the horizontal interval of the horizontal blanking interval ($t_8$ to $t_{12}$) by about a few percents, so that a further large blooming suppression effect is derived.

In other words, since the pulses $\phi_{AB}$ are supplied for both the first additional interval of $t_7$ to $t_8$ immediately before the horizontal blanking interval H-BLK and the second additional interval of $t_{12}$ to $t_{13}$ immediately after the interval H-BLK, blooming can be prevented.

Moreover, since the first additional interval is longer than the second additional interval, no noise appears in the display range (IZ in FIG. 17) of the receiver. Namely, a time lag is generally caused in the signal in the processes of the signal by the circuits 502 to 504 or the like shown in FIG. 16.

For instance, a delay is caused between the outputs Vout2 and Vout3 shown in FIG. 17.

Therefore, in case of supplying the pulse $\phi_{AB}$ for the interval exceeding the interval H-BLK by a few percents and if the first and second additional intervals have the same duration, the AB noise in the second additional interval will have appeared in the display range IZ. Although the AB noise will not appear in the display range if the first and second additional intervals are together set to be short, the recombining capability contrarily deteriorates. To prevent this, in this embodiment, the first additional interval is set to be longer than the second additional interval as mentioned above, so that the maximum number of pulses $\phi_{AB}$ can be supplied.

On the other hand, although an example whereby the frequency of the AB pulse is relatively high is shown in this embodiment, this frequency may be low. In such a case, the invention also includes the case where the leading and trailing of the AB pulse are inhibited to prevent that the variations in the leading and trailing edges or the like of this pulse are mixed during the clamping operation.

As described above, according to the invention, since the $\phi_{AB}$ is made operative only for the horizontal blanking interval within the accumulation interval, a high power saving effect is obtained and the noise is inconspicuous.

The recombination is carried out for almost the whole horizontal blanking interval, for the first additional interval immediately before this interval, and for a second additional interval shorter than the first and which comes just after the horizontal blanking interval. Consequently, no noise is added to the signal read out from the image sensor and a high power saving effect is derived. Further, no noise appears in the display of the receiver and a high blooming prevention effect is obtained.

What is claimed is:

1. An image sensing apparatus comprising:
   (a) image sensing means for converting an optical image to an electrical signal;
   (b) recombining means for recombining a portion of charges in said image sensing means with the majority carrier; and
   (c) recombination control means for making said recombining means operative for almost the whole of the horizontal blanking interval, for a first additional interval immediately before said horizontal blanking interval, and for a second additional interval which is shorter than said first additional interval and which is immediately after said horizontal blanking interval, when the electrical signal in said image sensing means is read out at a standard television period.

2. An image sensing apparatus according to claim 1, wherein said image sensing means includes a CCD.

3. An image sensing apparatus according to claim 1, wherein said recombining means includes a recombination electrode to control a potential in said image sensing means.

4. An image sensing apparatus according to claim 3, wherein said image sensing means has a transfer electrode to read out the charges and said recombination electrode is provided independently of said transfer electrode.

5. An image sensing apparatus according to claim 1, wherein said recombination control means allows said recombining means to periodically perform the recombining operation.

6. An image sensing apparatus according to claim 1, further comprising clamping means for clamping an output of said image sensing means.

7. An image sensing apparatus according to claim 6, wherein said recombination control means does not change the operating state of said recombining means during the clamping operation of said clamping means.

8. An image sensing apparatus comprising:
   (a) first and second regions for converting incident light to charges;
   (b) recombining means for recombining a portion of the charges in said second region with the majority carrier;
   (c) instructing means for instructing the recording of a still image;
   (d) control means for allowing the charges to be respectively stored in said first and second regions for a predetermined interval in response to an instruction of said instructing means, and for driving said recombining means and thereafter adding the charges in said first and second regions and reading them out; and
   (e) recording means for recording the signal read out for only one image.

9. An image sensing apparatus according to claim 8, wherein said recombining means includes a recombination electrode to control a potential in said second region.

10. An image sensing apparatus according to claim 9, wherein said first and second regions include means for transferring the charges and said recombination electrode is provided independently of said charge transfer means.

11. An image sensing apparatus according to claim 8, wherein said control means allows said recombining means to periodically perform the recombining operation.

12. An image sensing apparatus according to claim 8, further comprising clamping means for clamping the read out signal.

13. An image sensing apparatus according to claim 12, wherein said control means holds constant the operating state of said recombining means during the clamping operation of said clamping means.

14. An image sensing apparatus according to claim 8, wherein said recording means records the signal corresponding to one picture plane, said signal comprising one field.

15. An image sensing apparatus according to claim 8, wherein said recording means records the signal corresponding to one picture plane, said signal comprising two fields.

16. An image sensing apparatus comprising:
   (a) a photodetecting section for converting an optical image to a charge signal;
   (b) recombining means for recombining a portion of charges in said photodetecting section with the majority carrier;
   (c) instructing means for instructing a changeover between a still mode in which only an image signal corresponding to one predetermined picture plane is formed in said photodetecting section and a movie mode in which a plurality of image signals are formed; and
   (d) control means for switching a recombining capability of said recombining means during the formation of an image in accordance with an instruction output of said instructing means,
   wherein said recombining capability in the still mode is controlled so as to be higher than said recombining capability in the movie mode.

17. An image sensing apparatus according to claim 16, wherein said photodetecting section includes a CCD.

18. An image sensing apparatus according to claim 16, wherein said recombining means includes an electrode to control the potential state in said photodetecting section.

19. An image sensing apparatus according to claim 18, wherein said control means allows said recombining means to periodically perform the recombining operation.

20. An image sensing apparatus according to claim 16, further comprising clamping means for clamping the signal formed in said photodetecting section.

21. An image sensing apparatus according to claim 20, wherein said control means holds constant the operating state of said recombining means during the clamping operation of said clamping means.

22. An image sensing apparatus according to claim 16, wherein said instruction means allows the image signal corresponding to one field to be formed in said photodetecting section in the still mode.

23. An image sensing apparatus according to claim 16, wherein said instructing means allows the image signal corresponding to two fields to be formed in said photodetecting section in the movie mode.

24. An image sensing apparatus according to claim 16, wherein said instructing means allows the charges to be stored in the same number of pixels in the still mode as in the movie mode.

25. An image sensing apparatus comprising:
(a) image sensing means for picking up an optical image;
(b) control means for allowing charges in said image sensing means to be combined periodically with charges of the opposite polarity; and
(c) instructing means for switching charge combination characteristics of said control means in accordance with an image pickup quantity using said image sensing means.

26. An image sensing apparatus according to claim 25, wherein said control means controls a potential in said image sensing means.

27. An image sensing apparatus according to claim 25, wherein said instructing means can instruct the image pickup of a still image and the image pickup of a movie image.

28. An image sensing apparatus according to claim 25, wherein said instructing means can instruct the recording of a still image and the recording of a movie image.

29. An image sensing apparatus according to claim 25, wherein said instructing means switches the combining capability of the charges in accordance with the image pickup quantity.

30. An image sensing apparatus comprising:
(a) image sensing means for picking up an optical image;
(b) readout means for periodically reading out an output of said image sensing means; and
(c) control means for allowing charges in said image sensing means to be combined with charges of the opposite polarity during an interval when said periodic readout operation is stopped and at the leading time and trailing time of said periodical readout operation.

* * * * *

UNITED STATES PATENT AND TRADEMARK OFFICE
CERTIFICATE OF CORRECTION

PATENT NO. : 4,663,669

DATED : May 5, 1987

INVENTOR(S) : TAKAO KINOSHITA ET AL.

It is certified that error appears in the above-identified patent and that said Letters Patent is hereby corrected as shown below:

COLUMN 1

Line 44, "drive" should read --driven--.
    Line 56, delete "as".

COLUMN 2

Line 63, delete "and".
    Line 67, delete "AB pulse $\phi$ AB".

COLUMN 3

Line 44, "a synchronous" should read --asynchronous--.

COLUMN 4

Line 53, "prevent" should read --present--.

COLUMN 5

Line 27, "a case" should read --the case--.

COLUMN 6

Line 67, "trailing of" should read --trailing edge of--.

COLUMN 7

Line 1, "t, to" should read --$t_4$ to--.
    Line 2, "t,)." should read --$t_6$).--.

UNITED STATES PATENT AND TRADEMARK OFFICE
CERTIFICATE OF CORRECTION

PATENT NO. : 4,663,669

DATED : May 5, 1987

INVENTOR(S) : TAKAO KINOSHITA ET AL.

It is certified that error appears in the above-identified patent and that said Letters Patent is hereby corrected as shown below:

COLUMN 9

Line 39, "be" should read --by--.

COLUMN 10

Line 24, "intput" should read --input--.
    Line 35, "it" (first occurrence) should read --if--.
    Line 40, "coutner" should read --counter--.

COLUMN 13

Line 68, "clamp circuit" should read --clamp pulse CPOB shown in Fig. 17. An output of the clamp circuit--.

Signed and Sealed this

Sixth Day of October, 1987

*Attest:*

DONALD J. QUIGG

*Attesting Officer*

*Commissioner of Patents and Trademarks*